(12) United States Patent
Deng

(10) Patent No.: US 7,399,124 B2
(45) Date of Patent: Jul. 15, 2008

(54) VCSEL ON SILICON INTEGRATED CIRCUIT

(75) Inventor: Hongyu Deng, Saratoga, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/608,390

(22) Filed: Dec. 8, 2006

(65) Prior Publication Data

US 2008/0135787 A1 Jun. 12, 2008

(51) Int. Cl.
*G02B 6/36* (2006.01)
(52) U.S. Cl. .......................................... 385/88; 385/53
(58) Field of Classification Search .................... 385/88
See application file for complete search history.

(56) References Cited

U.S. PATENT DOCUMENTS

| 7,209,235 | B2 * | 4/2007 | Blidegn ........................ 356/401 |
| 2004/0184703 | A1 * | 9/2004 | Bakir et al. .................... 385/14 |
| 2004/0190831 | A1 * | 9/2004 | Lu et al. ........................ 385/49 |

OTHER PUBLICATIONS

Gunn, Cary, Luxtera Inc., "CMOS Photonics for High-Speed Interconnects", IEEE, Mar.-Apr. 2006, pp. 58-66.
Gunn, Cary, PhD, et al, "CMOS Photonics—SOI Learns a New Trick", IEEE, 2005, pp. 7-13.

* cited by examiner

*Primary Examiner*—Jennifer Doan
(74) *Attorney, Agent, or Firm*—Workman Nydegger

(57) ABSTRACT

Vertical Cavity Surface Emitting Laser (VCSEL) on silicon substrate. One embodiment described herein includes an apparatus with functionality for communicating optical signals on a silicon integrated circuit chip. The apparatus includes a silicon based integrated circuit chip die. An optical waveguide is formed at the silicon based integrated circuit chip die. A vertical cavity surface emitting laser (VCSEL) is mechanically coupled to the silicon base integrated circuit chip die and optically coupled to the optical waveguide.

16 Claims, 1 Drawing Sheet

VCSEL ON SILICON INTEGRATED CIRCUIT

BACKGROUND

1. The Field of the Invention

The invention is generally related to integrating lasers with silicon integrated circuits. More specifically, the invention is directed to integrated vertical cavity surface emitting lasers with silicon integrated circuits.

2. Description of the Related Art

Computers and computing systems have affected nearly every aspect of modern living. Computers are generally involved in work, recreation, healthcare, transportation, entertainment, household management, etc. Computer processors have generally been fabricated using silicon semiconductor technology. Silicon semiconductor technology is rapidly approaching its limit in terms of speed and device size. Specifically there is a physical limit to transistor size on silicon substrates. As such there is a corresponding limit to the speed at which electronic signals can be transmitted.

One solution that has been proposed to overcome this inherent limitation to silicon semiconductors is to use optical signals for some data transmissions on a chip. Signals that are transmitted across the chip are sent using optical paths as opposed to the current electrical paths. This would help to alleviate electromagnetic limitations of copper based transmission lines and thus increase the speed at which signals could be sent. Shorter transmissions could still be accomplished using traditional approaches.

Specifically, some have proposed using silicon lasers powered from an external separate laser. Alternatively, edge emitter lasers based on indium phosphide glued to a silicon laser cavity have been proposed. However, current designs are costly in terms of power usage and semiconductor real estate. Edge emitter lasers typically have relatively high power supply requirements and are relatively large.

The subject matter claimed herein is not limited to embodiments that solve any disadvantages or that operate only in environments such as those described above. Rather, this background is only provided to illustrate one exemplary technology area where some embodiments described herein may be practiced.

SUMMARY

One embodiment described herein includes an apparatus with functionality for communicating optical signals on a silicon integrated circuit chip. The apparatus includes a silicon based integrated circuit chip die. An optical waveguide is formed at the silicon based integrated circuit chip die. A vertical cavity surface emitting laser (VCSEL) is mechanically coupled to the silicon base integrated circuit chip die and optically coupled to the optical waveguide.

Another embodiment includes a method of manufacturing a silicon based optical communication system. The method includes forming an optical waveguide at a silicon substrate. The method further includes optically coupling a VCSEL to the optical waveguide at the silicon substrate. The VCSEL is mechanically coupled to the silicon substrate.

Yet another embodiment includes a method of testing an optical communication system. The optical communication system includes a VCSEL connected mechanically to a silicon substrate, and coupled optically to an optical waveguide at the silicon substrate. The method includes modulating the VCSEL to cause the VCSEL to lase into the optical waveguide. The VCSEL is fabricated such that emissions from a first surface of the VCSEL are related to emissions from a second surface of the VCSEL. The method further includes measuring the emissions from the first surface of the VCSEL. The method further includes measuring an electrical signal caused by an emission from the second surface of the VCSEL. The emissions from the first surface of the VCSEL are compared to the electrical signal caused by the emission from the second surface of the VCSEL. A determination is made from the comparison to determine if the optical communication system is functioning properly.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
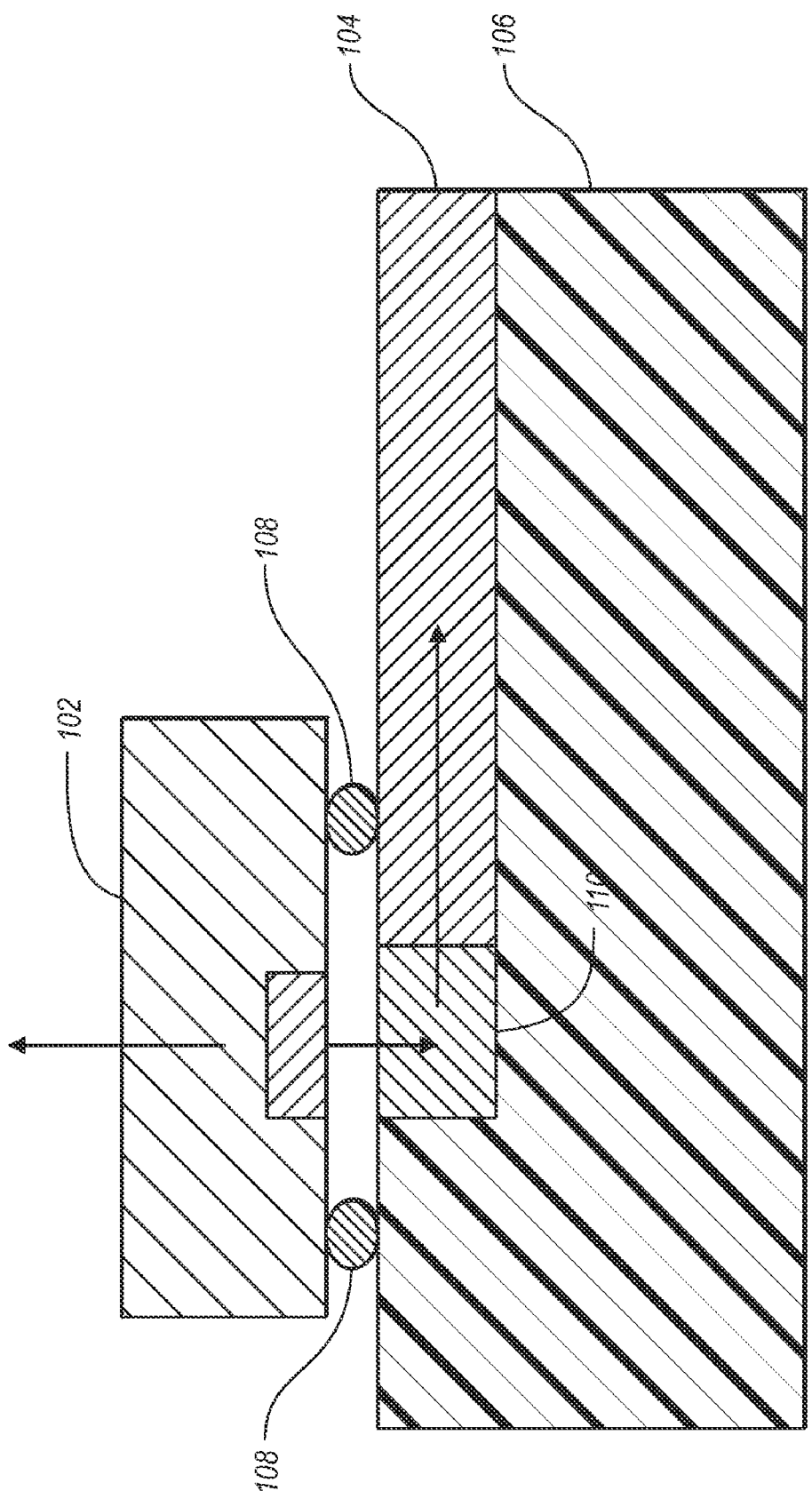
FIG. 1 illustrates an exemplary silicon die including a VCSEL.

One embodiment is directed to using a VCSEL with an optical waveguide formed at a silicon substrate. In particular, the silicon substrate may have one or more die formed thereon. Each die will eventually be cleaved from a silicon substrate wafer and included in a chip. Circuits are formed on each die. For example, various transistors may be formed on a die. The transistors may be coupled to form logic circuits. These logic circuits may be used in implementing microprocessors or other digital circuits. In some embodiments, a single die may include a number of different digital circuits. In contrast to previous techniques, the different digital circuits may communicate with one another using optical signals transmitted through optical waveguides as opposed electronic signals transmitted through conductors.

In one embodiment illustrated herein, the optical signals are generated using a vertical cavity surface emitting laser (VCSEL). VCSELs can be fabricated smaller than traditional edge emitter lasers. In addition, VCSELs typically have lower power consumption than edge emitter lasers. Further still, VCSELs have a narrower emission such that it is easier to couple more of the emitted optical signal into a waveguide.

In one embodiment, an optical waveguide may be formed in a die. The optical waveguide may be formed such that the optical waveguide optically connects two digital circuits. As such, an optical circuit that is transmitting data via the optical waveguide will typically include laser driver circuitry that can be electrically coupled to the VCSEL. The data to be sent can be used by the laser driver circuitry to modulate a VCSEL. The VCSEL is optically coupled to the waveguide such that optical signals can be transmitted from the VCSEL through the waveguide to a digital circuit that is to receive the data. Notably, in some embodiments, rather than using data to modulate the VCSEL, power signal can be applied to the VCSEL. For example, the laser may be operated in CW mode, while output from the top of the VCSEL and output caused by emissions from the bottom of the VCSEL are compared.

At the receiving digital circuit, typically an optically sensitive device such as a photodiode is included. The optical signals are converted by the optically sensitive device to electronic signals, which can then be used by other portions of the receiving digital circuit.

Referring now to FIG. 1, an illustrative embodiment is shown. FIG. 1 illustrates a VCSEL 102 optically coupled to a waveguide 104 at a silicon integrated circuit die 106. The VCSEL 102 is a discrete device. To couple the VCSEL 102 optically to the waveguide 104, the VCSEL is optically aligned with the optical waveguide 104. Several methods may be used to accomplish this alignment.

In one embodiment, the VCSEL 102 may be bonded to the silicon integrated circuit die 106 using flip-chip bonding and self aligning soldering techniques. Specifically, the VCSEL 102 may have bond pads formed on the VCSEL. The bond pads may be formed in a very precise manner using various techniques. Photolithography is one example of a technique that allows the bond pads to be precisely positioned on the VCSEL 102. Corresponding bond pads may be included on the silicon integrated circuit die 106. The bond pads on the silicon integrated circuit die 106 may also be precisely located on the silicon integrated circuit die 106. When the pads are soldered together, the VCSEL 102 and silicon integrated circuit die 106 will naturally tend to align if the solder pads are properly fabricated onto the VCSEL 102 and the silicon integrated circuit die 106. Illustratively, FIG. 1 illustrates solder balls 108. The solder balls 108 may be included on the VCSEL 102 when the VCSEL 102 is fabricated. The silicon integrated circuit die 106 may have metal contacts that are positioned such that when the VCSEL 102 is bonded to the silicon integrated circuit die 106, the VCSEL is positioned such that it is properly aligned such that the VCSEL is optically coupled to the optical waveguide 104. As such, light emitted from the VCSEL 102 can be coupled into the optical waveguide 104.

In an alternative embodiment, the VCSEL 102 may have fiducial marks on the underside (i.e. the side of the VCSEL that attaches to the silicon integrated circuit die) of the VCSEL 102. These fiducial marks may be formed using a precise method such as an etch or deposition method in a photolithographic process. Corresponding fiducial marks may be included on the silicon integrated circuit die 106. The VCSEL 102 may be transparent to infrared light. In particular, GaAs is typically transparent to vision systems with wavelengths of greater than 1.1 um. As such, an infrared camera can be used to align the fiducial marks on the VCSEL 102 with the fiducial marks on the silicon integrated circuit die 106. The VCSEL 102 can then be attached to the silicon integrated circuit die 106 using a bonding process including epoxy, solder or other suitable mechanical bonding.

FIG. 1 illustrates a VCSEL 102 coupled to the silicon integrated circuit die 106. The VCSEL 102 may be optimized for this particular application. For example, in one embodiment, the VCSEL 102 may be fabricated such that the aperture is smaller than might ordinarily be implemented in a VCSEL allowing for further reduced power requirements.

In one embodiment, the VCSEL 102 may be fabricated such that wafer level testing of an assembly including a VCSEL 102 on the silicon integrated circuit die 106 can be accomplished. As described previously, a die may be one of many die on a silicon wafer. Typically, several die, which will later be cleaved out of the wafer, will be formed on a wafer. Often, it is advantageous to be able to fabricate and test assemblies at the wafer level. In one embodiment, the VCSEL 102 can be optimized for wafer level fabrication and testing.

The following is a brief introduction to general VCSEL concepts. As its name implies, a VCSEL has a laser cavity that is sandwiched between and defined by two mirror stacks. A VCSEL is typically constructed on a semiconductor wafer such as Gallium Arsenide (GaAs). The VCSEL includes a bottom mirror constructed on the semiconductor wafer. Typically, the bottom mirror includes a number of alternating high and low index of refraction layers. As light passes from a layer of one index of refraction to another, a portion of the light is reflected. By using a sufficient number of alternating layers, a high percentage of light can be reflected by the mirror.

An active region that includes a number of quantum wells is formed on the bottom mirror. The active region forms a PN junction sandwiched between the bottom mirror and a top mirror, which are of opposite conductivity type (i.e. a p-type mirror and an n-type mirror). Free carriers in the form of holes and electrons are injected into the quantum wells when the PN junction is forward biased by an electrical current. At a sufficiently high bias current the injected minority carriers form a population inversion in the quantum wells that produces optical gain. Optical gain occurs when photons in the active region stimulate the transition of electrons from the conduction band to the valance band which produces additional photons in phase with the stimulating photons. When the optical gain is equal to the loss from the two mirrors and the cavity, laser oscillation occurs. The free carrier electrons in the conduction band quantum well are stimulated by photons to recombine with free carrier holes in the valence band quantum well. This process results in the stimulated emission of in phase photons, i.e. coherent light.

The active region may also include an oxide aperture formed using one or more oxide layers formed in the top and/or bottom mirrors near the active layer. The oxide aperture serves both to form an optical cavity and to direct the bias current through the central region of the cavity that is formed.

A top mirror is formed on the active region. The top mirror is similar to the bottom mirror in that it generally comprises a number of layers that alternate between a high index of refraction and a lower index of refraction. Generally, the top mirror has fewer mirror periods of alternating high index and low index of refraction layers, to enhance light emission from the top of the VCSEL. Notably, the number of mirror periods can be optimized for wafer level testing of an assembly including a VCSEL and a silicon integrate circuit die as will be explained in more detail below.

In one embodiment, the top and bottom mirrors may be optimized to allow for wafer level testing. Typically, a VCSEL will emit light from both the top and bottom mirrors. As such, the top and bottom mirrors can be designed such that the emissions from each of the mirrors is proportional to the other. As such, by measuring the optical output of the top mirror, certain assumptions can be made about the optical power of the bottom mirror. Referring once again to FIG. 1, an assembly including the VCSEL 102 and the silicon integrated circuit die 106 can be tested by measuring an electrical signal generated by optical sensing circuitry in the silicon integrated circuit die 106. This electrical signal can be compared to what the expected optical signal emitted at the bottom mirror should be. This comparison can be used as data to determine if the assembly is functioning properly. Notably, using this arrangement, the testing can be performed at the wafer level, without the need to separate the die 106 from the wafer prior to testing.

The VCSEL 102 may include various other features. For example, in one embodiment, the VCSEL 102 may include coupling optics. The coupling optics may be used to focus the VCSEL output into the optical waveguide 104. As will be discussed further below, and as illustrated in FIG. 1, alternate embodiments may include the coupling optics at the optical waveguide.

Various VCSEL wavelengths may be used as well. For example, in one embodiment, the VCSEL 102 may be a long wavelength VCSEL such as a 1310 nm or 1550 nm VCSEL. Other wavelengths such as 850 nm or other appropriate wavelengths may be alternatively used.

With continued reference to FIG. 1, various details and alternatives for the silicon integrated circuit die 106 are illustrated. Notably, in the example illustrated, only a single die is illustrated. However, embodiments may be implemented in methods where assemblies are manufactured and/or tested at the wafer level. The die may be a die on a wafer substrate that includes a number of die. Additionally, a single wafer, such as a 10 or 12 inch wafer may have numerous VCSELs coupled to the wafer. Further, individual die on a wafer may have multiple VCSELs. For example, in one embodiment, a die may have VCSELs and silicon based photo detectors at different portions of the die to allow for sending and receiving optical data. By using VCSEL technology, the VCSELs can be coupled to the individual die as needed prior to actually cleaving the individual die. Additionally, as will be discussed in more detail below, testing can be done on the assembly at the wafer level prior to cleaving individual die.

Notably, the individual die may have logic circuits or other circuits fabricated on them using various semiconductor manufacturing techniques. Some embodiments may include optical detectors, as described above, fabricated using silicon integrated circuit technology. Other technologies may be used as well. For example, in one embodiment, discrete photo detectors may be manufactured and appropriately attached to the die.

FIG. 1 further illustrates an optical waveguide 104 formed at the silicon integrated circuit die 106. The optical waveguide 104 can be used between logical circuits to connect the logical circuits to one another. One logical circuit may have circuitry for driving a VCSEL for transmitting optical data on the optical waveguide 104 where the VCSEL is optically coupled to the waveguide 104. Another circuit at the opposing end of the waveguide 104 may have a photo detector and amplifier circuitry for receiving the optical data.

The optical waveguide may be fabricated on a wafer substrate. For example, in one embodiment, the optical waveguide 104 may be a SiO2 structure grown on the silicon substrate. Optical waveguides on silicon may be obtained from Luxtera, Inc. of Carlsbad, Calif.

The optical waveguide 104 may include coupling optics 110. The coupling optics facilitate the optical coupling of the VCSEL 102 to the optical waveguide 104.

As explained previously, testing may be accomplished at the wafer level prior to cleaving individual die. A VCSEL will typically have emissions directed out of both the top and bottom mirrors. Further, the emissions are typically related to one another by some factor. Further still, the factor can generally be controlled by controlling the fabrication of the mirrors, including controlling the number of different index of refraction layers. Thus, the VCSEL 102 can be designed such that a given optical emission from the top of the VCSEL 102 corresponds to a given optical emission from the bottom of the VCSEL 102.

As noted previously, optical detection circuitry may be included on the silicon based integrated circuit chip die 106. The optical detection circuitry may be included for testing purposes or simply as part of the receiver for receiving optical signals. The optical detection circuitry can be monitored such that an electrical signal from the optical detection circuitry, cause by an emission from the bottom of the VCSEL, can be compared with an emission from the top of the VCSEL. As such, various verification and testing procedures can be accomplished.

Notably, because the VCSEL emits from both the top and the bottom, the VCSEL 102 may be used as a communication interconnect with other die or other circuits. Specifically, an optical waveguide, such as an optical fiber, may be coupled to the top surface of the VCSEL 102. This fiber may be used to communicate with other circuits implemented on the same chip, but on a different die. Additionally, in some embodiments, an optical coupler may be coupled to the top of the VCSEL 102. This would allow different chips or different systems to be interconnected optically.

Several different functions can be implemented using emissions from both the top and bottom of the VCSEL 102. For example, in one embodiment, the emissions from the top of the VCSEL may be monitored to for troubleshooting purposes. A data analyzer can be connected optically to the top of the VCSEL 102 to analyze data transmitted between circuits from the bottom of the VCSEL 102 using the optical waveguide 104.

In another embodiment, semiconductor chips may be interconnected optically. In the fabrication process, when the silicon die 106 with attached VCSEL 102 is packaged, the package can be implemented to include a fiber connector and optical coupling lenses to couple to the VCSEL and/or an optical detector such that chips can be interconnected by fiber connections. Thus, optical signals can be sent from chip to chip within a system.

Various schemes may be used to ensure that data is routed appropriately. For example, signals sent by the VCSEL 102 may include header information to indicate whether the signal is intended for inter-die communication, or if the signal is intended for a specific external chip. Alternatively, signals may be simply broadcast in a fashion such that any circuit to which the signal is appropriate can capture the signal, whether the signal be intended for a circuit on the same die 106 as the VCSEL 102 or if the signal is intended for a circuit external to the die 102.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A method of testing an optical communication system, wherein the optical communication system comprises a VCSEL coupled mechanically to a silicon substrate, and coupled optically to an optical waveguide at the silicon substrate, the method comprising:

applying a signal to the VCSEL to cause the VCSEL to lase into the optical waveguide, wherein the VCSEL is fabricated such that emissions from a first surface of the VCSEL are related to emissions from a second surface of the VCSEL;

measuring the emissions from the first surface of the VCSEL;

measuring an electrical signal caused by an emission from the second surface of the VCSEL;

comparing the emissions from the first surface of the VCSEL to the electrical signal caused by the emission from the second surface of the VCSEL; and determining from the comparison if the optical communication system is functioning properly.

2. The method of claim 1, wherein the method is performed on individual die at a wafer scale, such that testing is performed prior to cleaving the individual die.

3. The method of claim 1, wherein measuring an electrical signal caused by an emission from the second surface of the VCSEL is performed using a photodiode optically coupled to the optical waveguide at the silicon substrate, and wherein the photodiode is implemented as part of a receiver circuit for receiving optical communication signals.

4. The method of claim 1, wherein measuring an electrical signal caused by an emission from the second surface of the VCSEL is performed using a photodiode optically coupled to the optical waveguide at the silicon substrate, and wherein the photodiode is implemented as part of a testing circuit.

5. The method of claim 1, wherein applying a signal to the VCSEL comprises modulating the VCSEL.

6. The method of claim 1, wherein the VCSEL is mechanically coupled to the silicon substrate using VCSEL flip-chip bonding to silicon using self aligning contacts.

7. The method of claim 1, wherein the VCSEL is mechanically coupled to the silicon substrate using fiducial marks on the VCSEL and on the silicon substrate for aligning the VCSEL to the silicon substrate.

8. The method of claim 1, wherein the VCSEL is fabricated using GaAs.

9. The method of claim 1, wherein the VCSEL is a long wavelength VCSEL.

10. The method of claim 1, wherein coupling optics are coupled to the optical waveguide.

11. The method of claim 1, wherein the optical waveguide comprises a SiO2 structure.

12. The method of claim 1, wherein a lens is coupled to the VCSEL.

13. The method of claim 1, wherein a lens is coupled to the optical waveguide.

14. The method of claim 1, wherein optical sensing circuitry is fabricated on the silicon substrate and is optically coupled to the optical waveguide.

15. The method of claim 1, wherein the VCSEL is configured to couple to an external optical waveguide in addition to the optical waveguide formed at the silicon substrate.

16. The method of claim 1, wherein an optical coupler is coupled to VCSEL so as to allow different chips or different systems to be interconnected optically.

* * * * *